United States Patent
Dewey et al.

(10) Patent No.: US 11,538,803 B2
(45) Date of Patent: Dec. 27, 2022

(54) INTEGRATION OF III-V TRANSISTORS IN A SILICON CMOS STACK

(71) Applicant: Intel Corporation, Santa Clara, CA (US)

(72) Inventors: Gilbert Dewey, Beaverton, OR (US); Telesphor Kamgaing, Chandler, AZ (US); Aleksandar Aleksov, Chandler, AZ (US); Gerogios Dogiamis, Chandler, AZ (US); Hyung-Jin Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 16/221,086

(22) Filed: Dec. 14, 2018

(65) Prior Publication Data

US 2020/0194427 A1    Jun. 18, 2020

(51) Int. Cl.
| | |
|---|---|
| H01L 29/40 | (2006.01) |
| H01L 21/00 | (2006.01) |
| H01L 27/07 | (2006.01) |
| H01L 21/8238 | (2006.01) |
| H01L 23/538 | (2006.01) |
| H01L 23/00 | (2006.01) |
| H01L 25/07 | (2006.01) |
| H01L 29/16 | (2006.01) |

(Continued)

(52) U.S. Cl.
CPC .. *H01L 27/0705* (2013.01); *H01L 21/823871* (2013.01); *H01L 23/5384* (2013.01); *H01L 24/17* (2013.01); *H01L 24/81* (2013.01); *H01L 25/074* (2013.01); *H01L 29/16* (2013.01); *H01L 29/20* (2013.01); *H01L 29/7851* (2013.01)

(58) Field of Classification Search
CPC ................ H01L 23/5384; H01L 21/823871
USPC .......... 257/686, 778, 107–109; 438/107–109
See application file for complete search history.

(56) References Cited

U.S. PATENT DOCUMENTS

| | | | |
|---|---|---|---|
| 7,875,952 B1 | 1/2011 | Elliot | |
| 8,044,464 B2 * | 10/2011 | Yamazaki | ........... H01L 27/0688 257/350 |

(Continued)

FOREIGN PATENT DOCUMENTS

WO    WO 2018063160    4/2018

OTHER PUBLICATIONS

Office Action from European Patent Application No. 19198874, dated Mar. 19, 2020, 9 pgs.

*Primary Examiner* — Calvin Lee
(74) *Attorney, Agent, or Firm* — Schwabe, Williamson & Wyatt, P.C.

(57) ABSTRACT

Embodiments disclosed herein include semiconductor devices and methods of forming such devices. In an embodiment the semiconductor device comprises a first semiconductor layer, where first transistors are fabricated in the first semiconductor layer, and a back end stack over the first transistors. In an embodiment the back end stack comprises conductive traces and vias electrically coupled to the first transistors. In an embodiment, the semiconductor device further comprises a second semiconductor layer over the back end stack, where the second semiconductor layer is a different semiconductor than the first semiconductor layer. In an embodiment, second transistors are fabricated in the second semiconductor layer.

15 Claims, 8 Drawing Sheets

(51) Int. Cl.
*H01L 29/20* (2006.01)
*H01L 29/78* (2006.01)

(56) References Cited

U.S. PATENT DOCUMENTS

| | | | |
|---|---|---|---|
| 8,536,629 B2* | 9/2013 | Tada | H01L 27/10802 |
| | | | 257/288 |
| 9,331,071 B2* | 5/2016 | Sunamura | H01L 29/78618 |
| 9,711,501 B1* | 7/2017 | Basker | H01L 29/4175 |
| 10,692,839 B2* | 6/2020 | Dasgupta | H01L 27/0605 |
| 10,748,901 B2* | 8/2020 | Rubin | H01L 27/092 |
| 11,121,021 B2* | 9/2021 | Or-Bach | H01L 21/823475 |
| 2018/0053748 A1 | 2/2018 | Lu | |
| 2018/0076260 A1 | 3/2018 | Walke | |
| 2018/0145052 A1 | 5/2018 | Dasgupta | |

\* cited by examiner

INTEGRATION OF III-V TRANSISTORS IN A SILICON CMOS STACK

TECHNICAL FIELD

Embodiments of the disclosure are in the field of semiconductor structures and processing and, in particular, to III-V transistors that are co-integrated with a silicon CMOS stack.

BACKGROUND

One solution to sending information from chip to chip or server to server over mid-range distances is through waveguides. In order to send large amounts of data efficiently, high speed transceivers are necessary. The technical term that typically indicates transistor speed is the maximum oscillation frequency ($F_{max}$). The transistors that make up the high speed circuits required to send and receive the data from a waveguide are fabricated on a silicon substrate using state of the art silicon CMOS processing. However, due to limitations arising from fundamental electron and hole transport in silicon and increasing capacitance associated with scaling, there will be a limit to the maximum oscillation frequency that a solely silicon based transistor can achieve. This limits the data rate, size, and efficiency with which data is transmitted from system to system over a waveguide.

DESCRIPTION OF THE EMBODIMENTS

Embodiments described herein comprise semiconductor devices with a III-V transistor co-integrated with a silicon CMOS and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, transceivers that utilize silicon are inherently limited in maximum oscillation frequency ($F_{max}$) by fundamental electron and hole transport. Accordingly, embodiments disclosed herein include semiconductor devices that include transceiver functionality implemented in III-V, III-nitride, or antimonide material systems. III-V, III-nitride, and antimonide material systems (e.g., InP, InGaAs, InAs, GaAs, GaN, InSb, GaSb, etc.) have higher electron mobilities, lower electron effective mass, and lower intrinsic gate capacitance compared to silicon based transistors. This higher carrier mobility combined with lower density of states (DOS) allows for an intrinsic transistor speed for these systems that can be approximately twice that (or more) of silicon transistors. For example, the $F_{max}$ of transistors fabricated on III-V, III-nitride, or antimonide material systems may be 1 THz or larger. This allows for higher maximum oscillation frequency and thus, improved data volumes and data rates over a waveguide.

While III-V, III-nitride, and antimonide systems exhibit improved performance with respect to oscillation frequency, integration of such systems into a semiconductor device is currently a challenge. In some examples, the entire semiconductor device (i.e., the transistors for the transceiver and the CMOS transistors) may be fabricated on a III-V, III-nitride, or antimonide substrate. However, such integration schemes are expensive and does not allow for optimization of the CMOS transistors.

Accordingly, embodiments disclosed herein include CMOS transistors that are fabricated on a silicon substrate and monolithically integrating III-V, III-nitride, or antimonide material systems in the upper metal layers of the back end stack of the silicon CMOS device. Such an integration may be implemented by a layer transfer of a III-V, III-nitride layer, or antimonide on which the transceiver transistors may be fabricated. A unique attribute of some III-V, III-N, and antimonide material systems is that the processing temperature at which highly doped source and drain material necessary for high performance transistor fabrication may be implemented at temperatures of approximately 500° C. or lower. This makes the processing steps needed to fabricate the high performance III-V, III-N, or antimonide transistor compatible with back end processing temperatures (metal layers) and will not negatively impact the performance of the system.

In an additional embodiment, III-V, III-nitride, or antimonide chiplets may be fabricated and attached to the back end stack of the silicon CMOS device with face to face or back to face chip to chip bonding. Using chip to chip bonding allows separate processing temperatures, pitches, and possible metals that would allow engineering processing conditions unique to silicon and III-V, III-nitride, or antimonide simultaneously to maximize performance. Yield can also be enhanced with chip to chip bonding by eliminating poor yielding systems by a pick and place processes used for the chip to chip bonding.

In addition to providing improved $F_{max}$, embodiments also reduce the distance between the waveguide (which is on a package substrate) and the III-V, III-nitride, or antimonide transceiver transistors. For example, the III-V, III-nitride, or antimonide transistors may be fabricated close to the bumps to which the package substrate is attached. Accordingly, losses are minimal and the fast $F_{max}$ of the III-V, III-nitride, or antimonide transistors can be utilized for efficient and fast data transfers over waveguides.

Figure 1A:
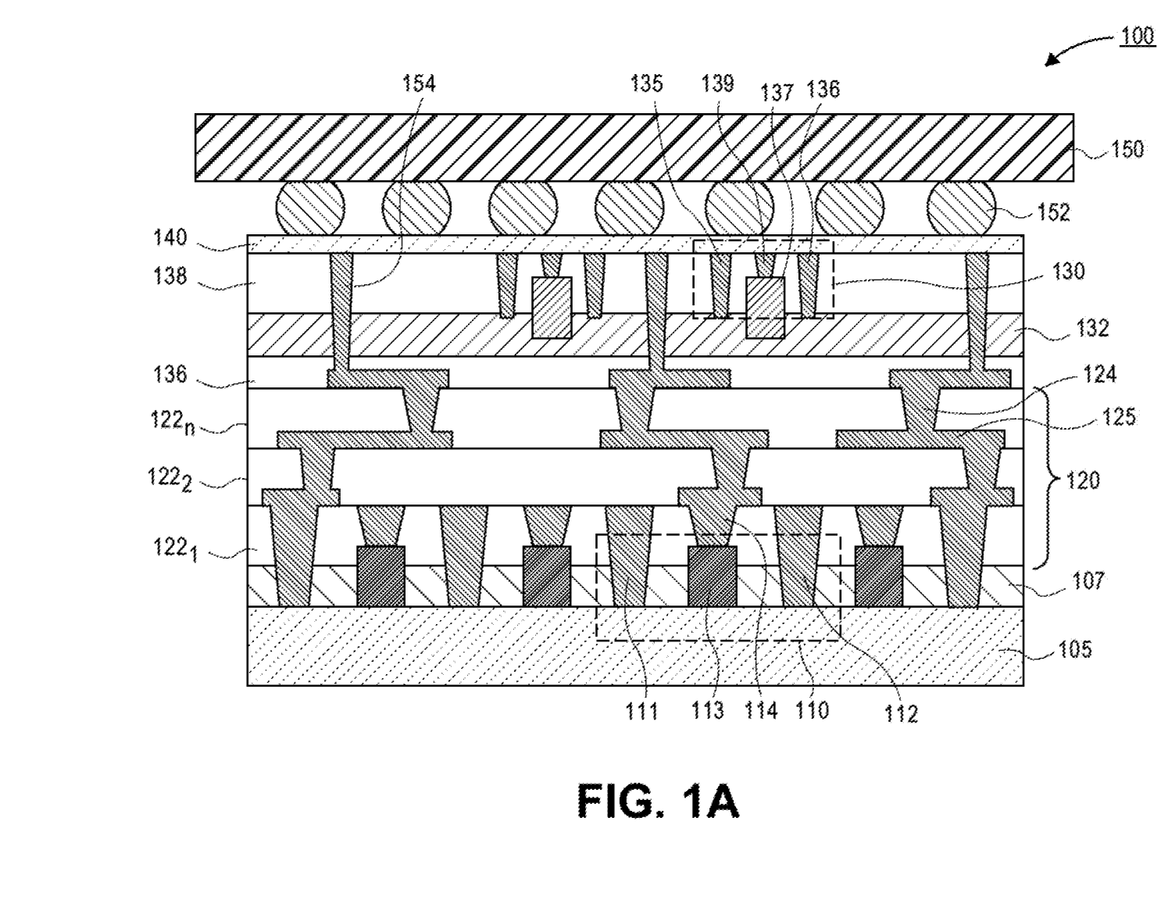
FIG. 1A is a cross-sectional illustration of a semiconductor device with a first semiconductor substrate and a second semiconductor layer embedded in the back end stack, in accordance with an embodiment.

Referring now to FIG. 1A, a cross-sectional illustration of a semiconductor device 100 is shown, in accordance with an embodiment. In an embodiment, the semiconductor device 100 may comprise a first semiconductor substrate 105. The first semiconductor substrate 105 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials.

The first semiconductor substrate 105, depending on the stage of manufacture, often includes transistors, integrated circuitry, and the like. In a specific embodiment, a plurality of first transistors 110 may be fabricated on the first semiconductor substrate 105. For example, the first semiconductor substrate 105 may comprise silicon and the first transistors 110 may be CMOS transistors. In an embodiment, the first transistors 110 may comprise a gate 113 (connected to a gate contact 114) and a source electrode 111 and a drain electrode 112 (connected to source and drain regions in the first semiconductor substrate 105). In an embodiment, the source and drain electrodes 111, 112 may pass through an insulating layer 107. In the illustrated embodiment, the first transistors 110 are illustrated as planar transistors. However, it is to be appreciated that the first transistors 110 may also be non-planar transistors, such as tri-gate transistors, nanowire transistors, or the like.

In an embodiment, a back end stack 120 may be formed over the first semiconductor substrate 105. The back end stack 120 may comprise metal layers 125 and vias 124 that are electrically coupled to the first transistors 110. In an embodiment, the back end stack 120 may comprise a plurality of back end interlayer dielectric (ILD) layers $122_{1-n}$. While three ILDs 122 are shown in FIG. 1A, it is to be appreciated that there may be any number of ILD layers 122. ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, electrodes (e.g., the gate electrode, the source electrode, and the drain electrode), conductive lines 125, and vias 124 are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal electrodes may include barrier layers (e.g., layers including one or more of Ta, TaN, Ti or TiN), stacks of different metals or alloys, etc. Thus, the electrodes may be a single material layer, or may be formed from several layers, including conductive liner layers and fill layers. Any suitable deposition process, such as electroplating, chemical vapor deposition or physical vapor deposition, may be used to form electrodes. In an embodiment, the electrodes are composed of a conductive material such as, but not limited to, Cu, Al, Ti, Zr, Hf, V, Ru, Co, Ni, Pd, Pt, W, Ag, Au or alloys thereof.

In an embodiment, a second semiconductor layer 132 may be formed above the back end stack 120. In a particular embodiment, the second semiconductor layer 132 may comprise a III-V material systems, III-nitride material systems, or antimonide material systems. For example, the second semiconductor layer 132 may comprise InP, InGaAs, InAs, GaAs, GaN, InSb, GaSb, or the like. In an embodiment, the second semiconductor layer 132 may be fabricated on a separate substrate (not shown) and transferred onto the back end stack 120 with a layer transfer process. In an embodiment, the second semiconductor layer 132 may have a thickness that is between 10 nm and 50 nm. In an embodiment, the second semiconductor layer 132 may be secured to the back end stack 120 by an adhesive layer 136. For example, the adhesive layer 136 may be an oxide or the like.

In an embodiment, a plurality of second transistors 130 may be fabricated in the second semiconductor layer 132. In a particular embodiment, the second transistors 130 may be transistors for RF processing. For example, the second transistors 130 may be used as a transceiver for sending and receiving signals propagated along a waveguide (not shown) in the package substrate 150. In an embodiment, the second transistors 130 may have a high maximum oscillation frequency $F_{max}$. For example, the second transistors 130 may have an $F_{max}$ that is approximately 1 THz or greater. Since the second transistors 130 are positioned above the back end stack 120, the transistors 130 are located proximate to the bumps 152 used to attach the package substrate 150. Accordingly, losses are minimal and the fast $F_{max}$ of the III-V, III-nitride, or antimonide transistors can be utilized for efficient and fast data transfers over waveguides.

In an embodiment, the second transistors 130 may be fabricated into the second semiconductor layer 132 prior to the layer being transferred onto the back end stack 120. In other embodiments, the second transistors 130 may be fabricated after the second semiconductor layer 132 is transferred onto the back end stack 120. Whereas processing temperatures for fabricating silicon based transistors are high temperature processing operations and are not compatible with the metal layers of the back end stack 120, transistor fabrication in III-V systems, III-nitride systems, and antimonide systems (e.g., InSb, GaSb, etc.) utilize relatively low temperature processes that are compatible with the metal layers of the back end stack 120. For example, the temperatures used to fabricate the second transistors 130 may be less than approximately 500° C.

In an embodiment, vias 154 may pass through the second semiconductor layer 132 and any ILD layers 138 formed over the second semiconductor layer 132 to electrically couple the first transistors 110 to a redistribution layer 140. In an embodiment, the redistribution layer 140 may provide routing (not shown) to electrically couple the first transistors 110 and the second transistors 130 to bumps 152 and the package substrate 150.

In an embodiment, the second transistors 130 may comprise a source electrode 135, a drain electrode 136, a gate contact 139 and a gate electrode 137. In FIG. 1A the second transistors 130 are shown schematically with details omitted in order to not obscure embodiments described herein. More detailed illustrations of the second transistors 130 in accordance with various embodiments are shown in FIGS. 1B and 1C.

Figure 1B:
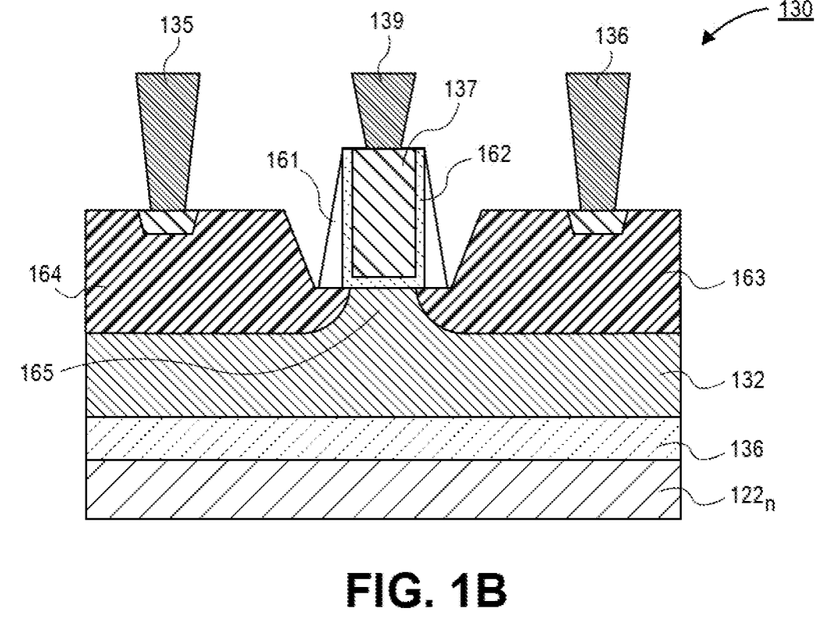
FIG. 1B is a cross-sectional illustration of a planar transistor in the second semiconductor layer, in accordance with an embodiment.
Figure 1C:
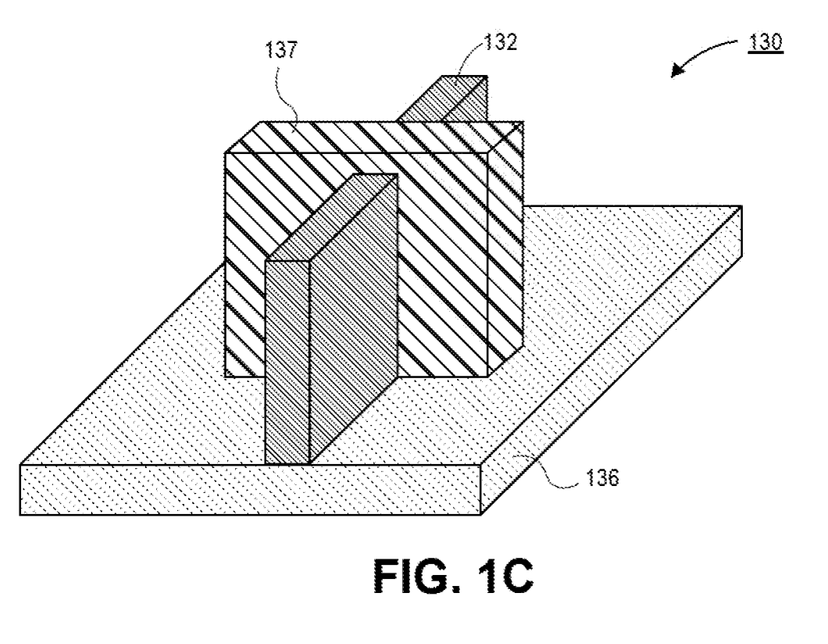
FIG. 1C is a cross-sectional illustration of a non-planar transistor in the second semiconductor layer, in accordance with an embodiment.

Referring now to FIG. 1B, a cross-sectional illustration of one of the second transistors 130 is shown, in accordance with an embodiment. In an embodiment, the second semiconductor layer 132 may be attached to an ILD layer 122*a* of the back end stack 120 by an oxide layer 136. In an embodiment, the second transistor 130 may be a planar transistor. In an embodiment, the second semiconductor layer 132 may comprise a source region 164 and a drain region 163 formed on opposite sides of a channel region 165. In an embodiment, the source region 164 and the drain region 163 may be epitaxially grown layers, such as InAs. It is to be appreciated that growth of such epitaxial layers may be implemented at low temperatures (e.g., below 500° C.).

In an embodiment, a gate electrode 137 may be formed above the channel region 165. In an embodiment, the gate electrode 137 may be any suitable conductive material. For example, the gate electrode 137 may comprise one or more of Cu, Al, Ti, Zr, Hf, V, Ru, Co, Ni, Pd, Pt, W, Ag, Au or alloys thereof. In an embodiment, the gate electrode 137 may also comprise stacks of one or more conductive layers. In an embodiment, the gate electrode 137 may be contacted by a gate contact 139. In an embodiment, a source electrode 135 may contact the source region 164 and a drain electrode 136 may contact the drain region 163.

The gate electrode 137 may be separated from the channel region 165 by a gate dielectric stack 162. In an embodiment, the gate dielectric stack 162 may comprise one or more high-k dielectric materials. As used herein, "high-k" dielectric materials refers to materials that have a k-value that is greater than the k-value of $SiO_2$. For example, "high-k" dielectric materials may refer to dielectric materials with a k-value that is greater than 3.9. In an embodiment, the gate dielectric stack may comprise one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, the gate dielectric stack 132 may also comprise high-k dielectric materials that are alloyed with or doped with silicon. In an embodiment, a spacer layer 161 may be formed along sidewalls of the gate dielectric stack 132. The spacer layer 161 may be an oxide or any other insulating material.

Referring now to FIG. 1C, a cross-sectional illustration of a second transistor 130 is shown, in accordance with an additional embodiment. As shown, the second transistor 130 may be a non-planar transistor. For example, the second semiconductor layer 132 may be patterned to form fins. A gate electrode 137 may then be formed along sidewalls and the top surface of the second semiconductor layer 132 to form a tri-gate transistor 130. In the illustrated embodiment, some features such as the gate dielectric layer, contacts to the source and drain region, and isolation material are omitted in order to not obscure embodiments disclosed herein. In an embodiment, such a fin-shaped structure may be fabricated into the second semiconductor layer 132 when a thickness of the second semiconductor layer 132 is approximately 50 nm or greater. While the non-planar transistor 130 is shown as a tri-gate device, it is to be appreciated that embodiments may also include other non-planar transistor devices, such as nano-wire transistors or the like.

Figure 1D:
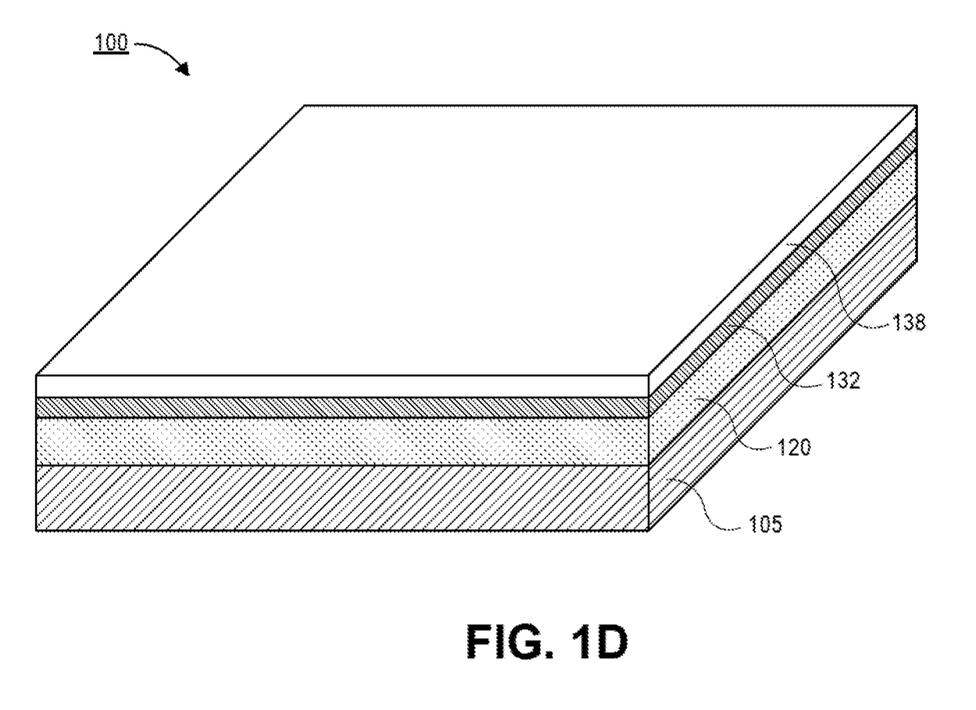
FIG. 1D is a perspective view illustration of a semiconductor device with a first semiconductor substrate and a second semiconductor layer embedded in the back end stack, in accordance with an embodiment.

Referring now to FIG. 1D, a perspective view illustration of a semiconductor device 100 is shown, in accordance with an embodiment. In FIG. 1D, the semiconductor device 100 is simplified in order to not obscure embodiments disclosed herein. Particularly, the conductive traces, vias, transistors, and the like are omitted. FIG. 1D illustrates that the layer transfer process used to form the second semiconductor layer 132 may be a blanket deposition process. That is, the second semiconductor layer 132 may have a footprint that is substantially the same as a footprint of the underlying layers (e.g., the backend stack 120 and the first semiconductor layer 105).

While a layer transfer process may be used to deposit a second semiconductor layer 132 that has the same footprint as the first semiconductor layer 105, it is to be appreciated that embodiments are not limited to such configurations. For example, the second semiconductor layer (and second transistors) may be fabricated as a chiplet that is subsequently attached to the back end stack with a chip to chip bonding configuration. Such an embodiment allows for the second semiconductor layer and the second transistors to be fabricated with processing conditions that are optimized to the formation of high $F_{max}$ transistors without needing to comply with process limitations of the back end stack. Additionally, such an embodiment allows for improved yield since only known functional chiplets may be integrated into the semiconductor device.

Figure 2A:
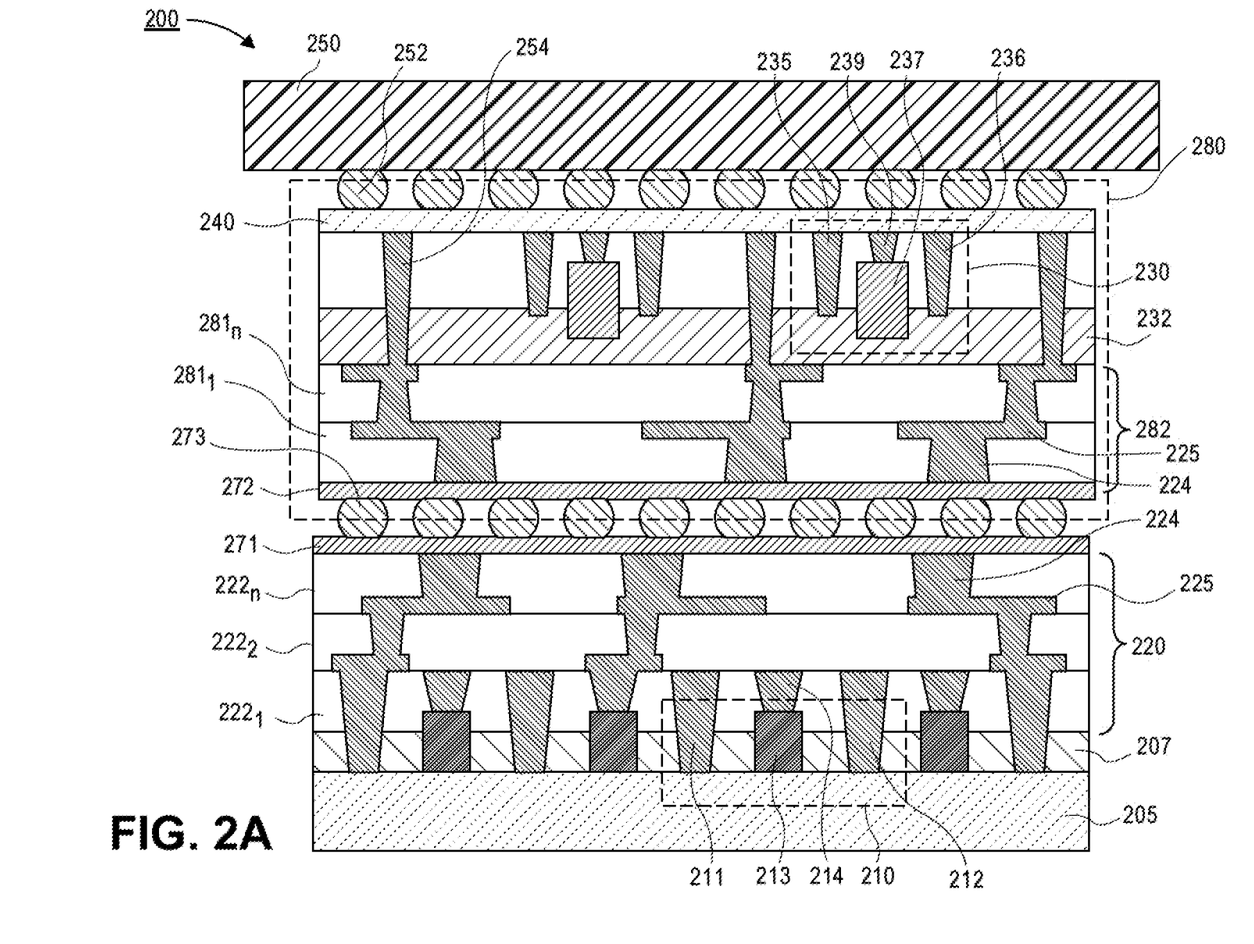
FIG. 2A is a cross-sectional illustration of a semiconductor device with a chiplet attached in a back to face configuration, in accordance with an embodiment.

Referring now to FIG. 2A, a cross-sectional illustration of a semiconductor device 200 with a first semiconductor substrate 205 and a chiplet 280 with a second semiconductor layer 232 attached to the back end stack 220 of the first semiconductor substrate 205 is shown, in accordance with an embodiment. In an embodiment, the semiconductor device 200 may comprise a first semiconductor substrate 205. The first semiconductor substrate 205, depending on the stage of manufacture, often includes transistors, integrated circuitry, and the like. In a specific embodiment, a plurality of first transistors 210 may be fabricated on the first semiconductor substrate 205. For example, the first semiconductor substrate 205 may comprise silicon and the first transistors 210 may be CMOS transistors. In an embodiment, the first transistors 210 may comprise a gate 213 (connected to a gate contact 214) and a source electrode 211 and a drain electrode 212 (connected to source and drain regions in the first semiconductor substrate 205). In an embodiment, the source and drain electrodes 211, 212 may pass through an insulating layer 207. In the illustrated embodiment, the first transistors 210 are illustrated as planar transistors. However, it is to be appreciated that the first transistors 210 may also be non-planar transistors, such as tri-gate transistors, nano-wire transistors, or the like.

In an embodiment, a back end stack 220 may be formed over the first semiconductor substrate 205. The back end stack 220 may comprise metal layers 225 and vias 224 that are electrically coupled to the first transistors 210. In an embodiment, the back end stack 220 may comprise a back end layers 282 that comprises a one or more ILD layers 2221-*n*. While three ILDs 222 are shown in FIG. 2A, it is to be appreciated that there may be any number of ILD layers 222. In an embodiment, a chip to chip bonding layer 271 may be formed over one of the ILDs 222g.

In an embodiment, a chiplet 280 may be bonded to the chip to chip bonding layer 271 with bumps 273. In an embodiment, the chiplet 280 may comprise a second semiconductor layer 232 and one or more ILD layers $281_{1-n}$. In an embodiment, conductive traces 225 and vias 224 and 254 may electrically couple the bonding layer 272 to a redistribution layer 240. Accordingly, one or more conductive paths through the chiplet 280 may be formed.

In an embodiment, a plurality of second transistors 230 may be fabricated in the second semiconductor layer 232. In a particular embodiment, the second transistors 230 may be transistors for RF processing. For example, the second transistors 230 may be used as a transceiver for sending and receiving signals propagated along a waveguide (not shown) in the package substrate 250. In an embodiment, the second transistors 230 may have a high maximum oscillation frequency $F_{max}$. For example, the second transistors 230 may have an $F_{max}$ that is approximately 1 THz or greater. Since the second transistors 230 are positioned above the back end stack 220, the second transistors 230 are located proximate to the bumps 252 used to attach the package substrate 250. Accordingly, losses are minimal and the fast $F_{max}$ of the III-V, III-nitride, or antimonide transistors can be utilized for efficient and fast data transfers over waveguides. In an embodiment, the second transistors 230 may be substantially similar to second transistors 130 described above. For example, second transistors 230 may be planar transistors (similar to what is shown in FIG. 1B) or non-planar transistors (similar to what is shown in FIG. 1C).

In FIG. 2A the chiplet 280 is shown as being attached to the back end stack 220 with a back to face configuration. That is, the second transistors 230 face towards the package substrate 250 in a direction opposite from the face of the first transistors 210. However, it is to be appreciated that embodiments are not limited to such configurations.

Figure 2B:
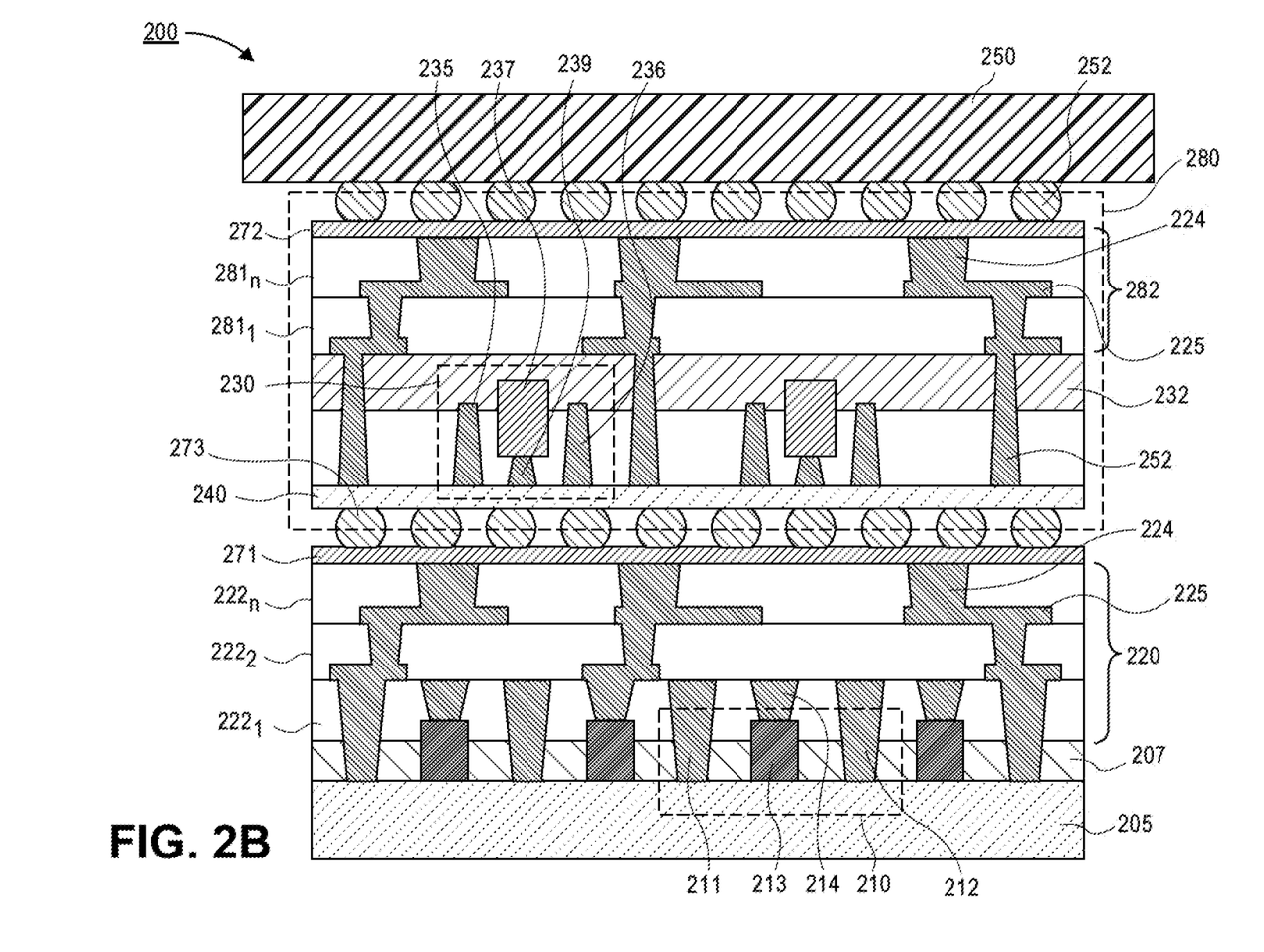
FIG. 2B is a cross-sectional illustration of a semiconductor device with a chiplet attached in a face to face configuration, in accordance with an embodiment.

For example, in FIG. 2B a cross-sectional illustration of a semiconductor device 200 with a chiplet 280 attached to the back end stack 220 with a face to face configuration is shown, in accordance with an embodiment. As shown, the faces of the second transistors 230 are oriented to face towards the first transistors 210 away from the package substrate 250. Other than the configuration of the chiplet (i.e., face to face with the first transistors), the semiconductor device 200 shown in FIG. 2B is substantially similar to the semiconductor device 200 shown in FIG. 2A.

Figure 2C:
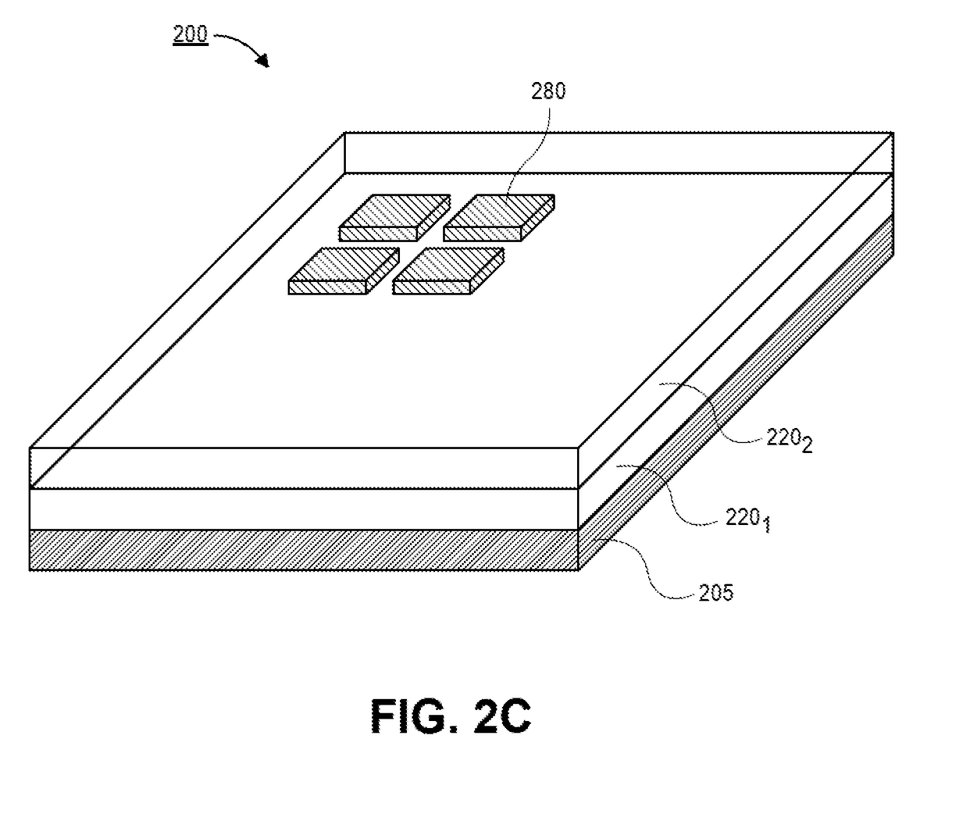
FIG. 2C is a perspective view illustration of a semiconductor device with an array of chiplets attached in the back end stack of the semiconductor device, in accordance with an embodiment.

Referring now to FIG. 2C, a perspective view illustration of a semiconductor device 200 is shown, in accordance with an embodiment. In FIG. 2C, the semiconductor device 200 is simplified in order to not obscure embodiments disclosed herein. Particularly, the conductive traces, vias, transistors, and the like are omitted. FIG. 2C illustrates that one or more chiplets 280 may be integrated into the semiconductor device 200. That is, a footprint of each of the chiplets 280 may be substantially smaller than a footprint of the underlying layers (e.g., the backend stack 220 and the first semiconductor layer 205). In an embodiment, the combined footprint of the one or more chiplets 280 may be approximately 10% the footprint of the first semiconductor layer 205.

In an embodiment, the chiplets 280 may be embedded in the back end stack 220. For example, in FIG. 2C, the chiplets 280 are shown as being over a first portion of the back end stack 2201 and embedded in a second portion of the back end stack 2202. However, it is to be appreciated that the chiplets 280 may also be formed entirely (or partially) above the back end stack 220.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 3:
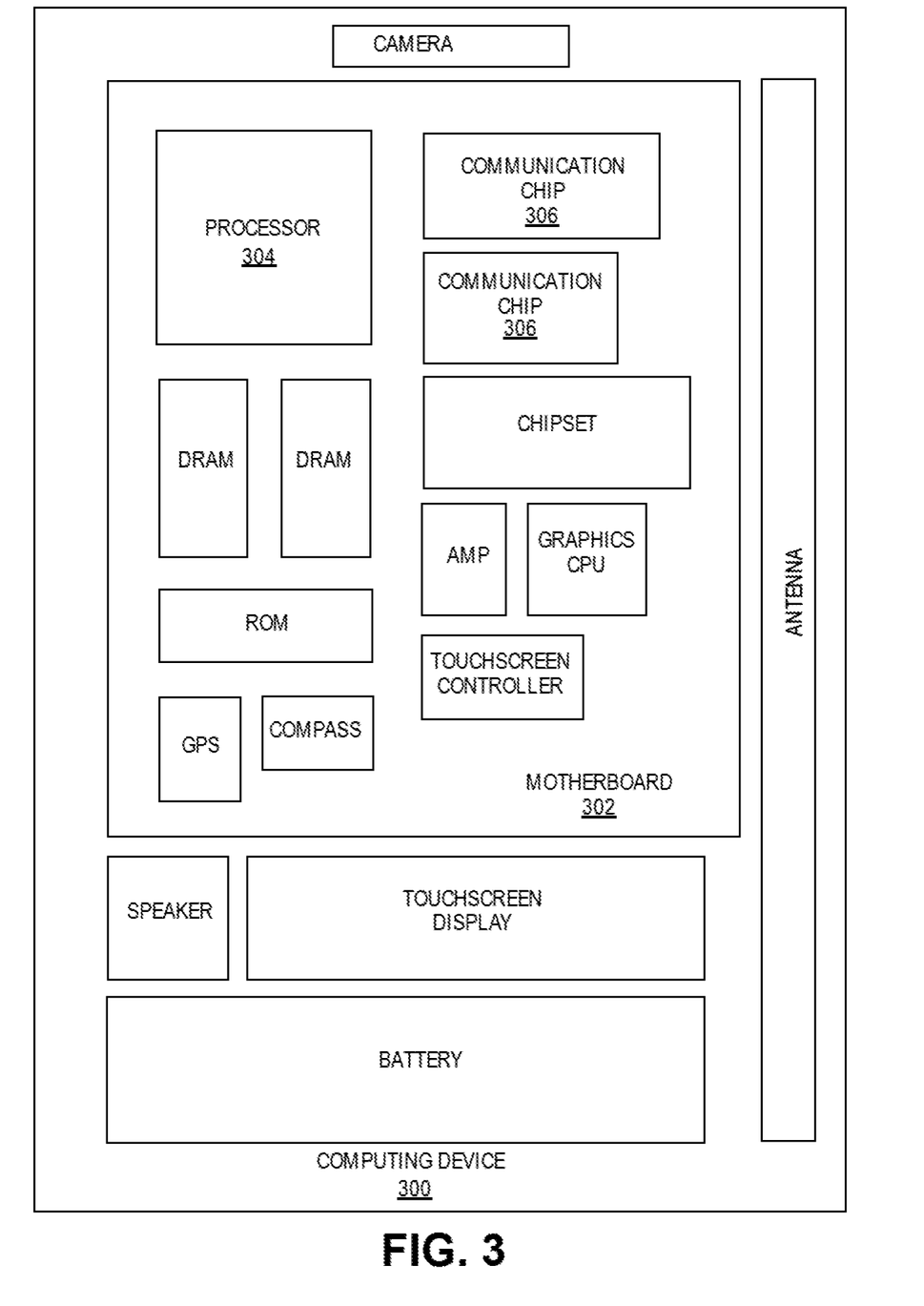
FIG. 3 illustrates a computing device in accordance with one implementation of an embodiment of the disclosure.

FIG. 3 illustrates a computing device 300 in accordance with one implementation of an embodiment of the disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In an embodiment, the integrated circuit die of the processor includes a first semiconductor layer with CMOS transistors and a second semiconductor layer with RF transistors integrated into the back end stack of the first semiconductor layer, as described herein. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In an embodiment, the integrated circuit die of the communication chip includes a first semiconductor layer with CMOS transistors and a second semiconductor layer with RF transistors integrated into the back end stack of the first semiconductor layer, as described herein.

In further implementations, another component housed within the computing device 300 may contain an integrated circuit die that includes a first semiconductor layer with CMOS transistors and a second semiconductor layer with RF transistors integrated into the back end stack of the first semiconductor layer, as described herein.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
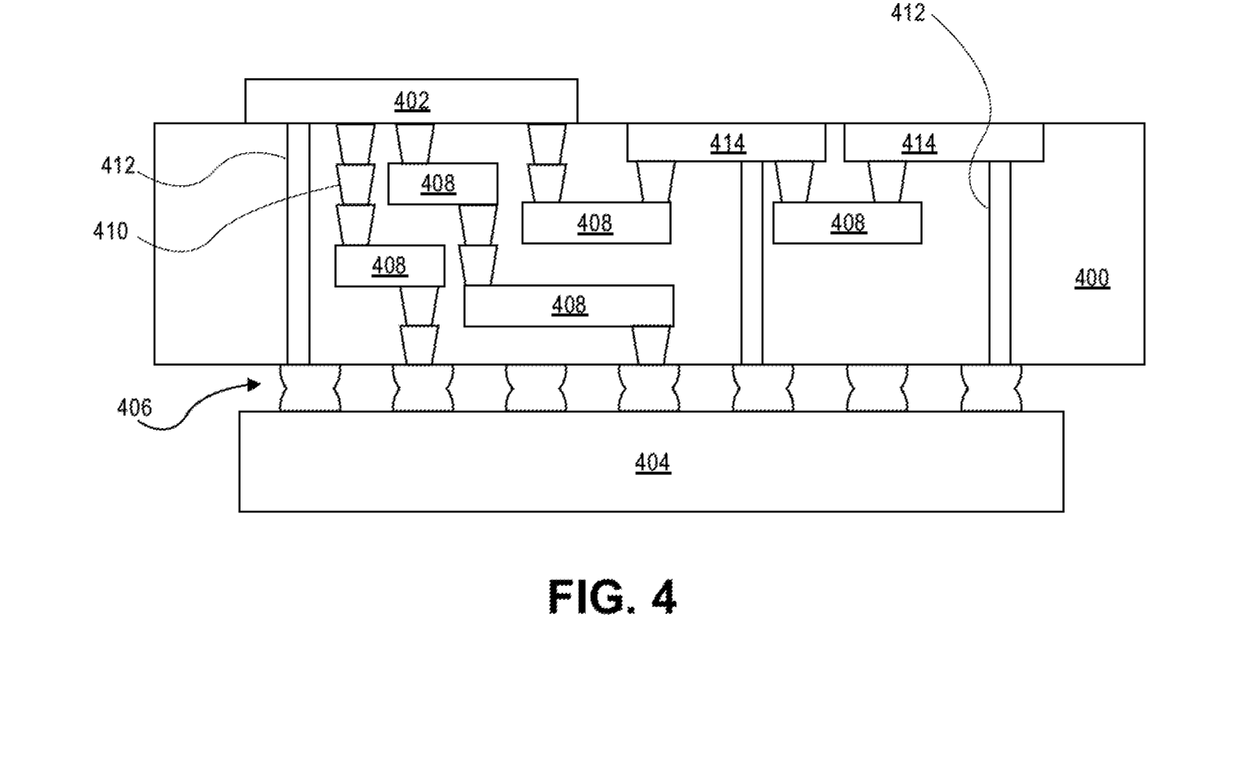
FIG. 4 is an interposer implementing one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments of the present disclosure includes a first semiconductor layer with CMOS transistors and a second semiconductor layer with RF transistors integrated into the back end stack of the first semiconductor layer, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a first semiconductor layer, wherein first transistors are fabricated in the first semiconductor layer; a back end stack over the first transistors, wherein the back end stack comprises conductive traces and vias electrically coupled to the first transistors; and a second semiconductor layer over the back end stack, wherein the second semiconductor layer is a different semiconductor than the first semiconductor layer, and wherein second transistors are fabricated in the second semiconductor layer.

Example 2: the semiconductor device of Example 1, wherein the first semiconductor layer comprises silicon, and wherein the second semiconductor layer comprises a III-V, III-nitride semiconductor, or antimonide material.

Example 3: the semiconductor device of Example 1 or Example 2, wherein second semiconductor layer is bonded to the back end stack by an oxide layer.

Example 4: the semiconductor device of Examples 1-3, wherein the second semiconductor layer has a footprint that is substantially equal to a footprint of the first semiconductor layer.

Example 5: the semiconductor device of Examples 1-4, wherein the second semiconductor layer is a layer transferred layer.

Example 6: the semiconductor device of Examples 1-5, wherein the second semiconductor layer has a thickness between 10 nm and 50 nm.

Example 7: the semiconductor device of Examples 1-6, wherein the second transistors are planar transistors.

Example 8: the semiconductor device of Examples 1-7, wherein the second transistors are non-planar transistors.

Example 9: the semiconductor device of Examples 1-8, wherein the second transistors are tri-gate transistors.

Example 10: the semiconductor device of Examples 1-9, wherein the second transistors are nano-wire transistors.

Example 11: the semiconductor device of Examples 1-10, further comprising: a redistribution layer over the second semiconductor layer.

Example 12: the semiconductor device of Examples 1-11, further comprising: vias from the redistribution layer to the back end stack, wherein the vias pass through the second semiconductor layer.

Example 13: the semiconductor device of Examples 1-12, further comprising: a package substrate coupled to the passivation layer.

Example 14: a semiconductor device, comprising: a first semiconductor layer, wherein first transistors are fabricated in the first semiconductor layer; a first back end stack over the first semiconductor layer, wherein the first back end stack comprises conductive traces and vias electrically coupled to the first transistors; and a chiplet coupled to the back end stack, wherein the chiplet comprises: a second semiconductor layer, wherein second transistors are fabricated in the second semiconductor layer; and a second back end stack over the second semiconductor layer, wherein the second back end stack comprises conductive traces and vias electrically coupled to the second transistors.

Example 15: the semiconductor device of Example 14, wherein the chiplet is coupled to the first back end stack in a back to face configuration.

Example 16: the semiconductor device of Example 14 or Example 15, wherein the chiplet is coupled to the first back end stack in a face to face configuration.

Example 17: the semiconductor device of Examples 14-16, wherein a footprint of the chiplet is smaller than a footprint of the first semiconductor layer.

Example 18: the semiconductor device of Examples 14-17, further comprising an array of chiplets coupled to the first back end stack.

Example 19: the semiconductor device of Examples 14-18, wherein the first semiconductor layer comprises silicon and the second semiconductor layer comprises a III-V, III-nitride, or antimonide semiconductor material.

Example 20: the semiconductor device of Examples 14-19, further comprising: a package substrate, wherein the chiplet is between the first semiconductor layer and the package substrate.

Example 21: the semiconductor device of Examples 14-20, wherein the chiplet is a transceiver, and wherein the first transistors are CMOS.

Example 22: an electronic package, comprising: a CMOS chip with a first semiconductor substrate, wherein the CMOS chip comprises a back end stack with a plurality of traces and vias electrically coupled to CMOS transistors fabricated into the first semiconductor substrate; a second semiconductor substrate over the back end stack, wherein RF transistors are fabricated into the second semiconductor substrate; and a package substrate, wherein the second semiconductor substrate is between the back end stack and the package substrate.

Example 23: the electronic package of Example 22, wherein the package substrate comprises dielectric waveguides for propagating signals from the RF transistors, wherein the first semiconductor substrate comprises silicon and the second semiconductor substrate comprises a III-V, III-nitride, or antimonide semiconductor, and wherein a maximum oscillation frequency of the RF transistors is greater than 1 THz.

Example 24: a computing device, comprising: a motherboard; an integrated circuit die coupled to the motherboard, wherein the integrated circuit die, comprises: a first semiconductor layer, wherein first transistors are fabricated in the first semiconductor layer; a back end stack over the first transistors, wherein the back end stack comprises conductive traces and vias electrically coupled to the first transistors; and a second semiconductor layer over the back end stack, wherein the second semiconductor layer is a different semiconductor than the first semiconductor layer, and wherein second transistors are fabricated in the second semiconductor layer.

Example 25: the computing device of Example 24, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

What is claimed is:

1. A semiconductor device, comprising:
   a first semiconductor layer, wherein first transistors are fabricated in the first semiconductor layer;
   a back end stack over the first transistors, wherein the back end stack comprises a plurality of alternating dielectric layers and layers of conductive traces, and the back end stack comprising conductive vias electrically coupled to the first transistors; and
   a second semiconductor layer over the back end stack, wherein the second semiconductor layer is a different semiconductor than the first semiconductor layer, and wherein second transistors are fabricated in the second semiconductor layer, wherein the back end stack is vertically between the first transistors and the second semiconductor layer.

2. The semiconductor device of claim 1, wherein the first semiconductor layer comprises silicon, and wherein the second semiconductor layer comprises a III-V, III-nitride semiconductor, or antimonide material.

3. The semiconductor device of claim 1, wherein the second semiconductor layer has a thickness between 10 nm and 50 nm.

4. The semiconductor device of claim 1, wherein the second transistors are planar transistors.

5. The semiconductor device of claim 1, further comprising:
   a redistribution layer over the second semiconductor layer.

6. The semiconductor device of claim 5, further comprising:
   vias from the redistribution layer to the back end stack, wherein the vias pass through the second semiconductor layer.

7. The semiconductor device of claim 5, further comprising:
   a package substrate coupled to the passivation layer.

8. The semiconductor device of claim 1, wherein the second transistors are non-planar transistors.

9. The semiconductor device of claim 8, wherein the second transistors are tri-gate transistors.

10. The semiconductor device of claim 8, wherein the second transistors are nano-wire transistors.

11. The semiconductor device of claim 1, wherein second semiconductor layer is bonded to the back end stack by an oxide layer.

12. The semiconductor device of claim 11, wherein the second semiconductor layer has a footprint that is substantially equal to a footprint of the first semiconductor layer.

13. The semiconductor device of claim 12, wherein the second semiconductor layer is a layer transferred layer.

14. A computing device, comprising:
   a motherboard;
   an integrated circuit die coupled to the motherboard, wherein the integrated circuit die, comprises:

a first semiconductor layer, wherein first transistors are fabricated in the first semiconductor layer;

a back end stack over the first transistors, wherein the back end stack comprises a plurality of alternating dielectric layers and layers of conductive traces, and the back end stack comprising conductive vias electrically coupled to the first transistors; and a second semiconductor layer over the back end stack, wherein the second semiconductor layer is a different semiconductor than the first semiconductor layer, and wherein second transistors are fabricated in the second semiconductor layer, wherein the back end stack is vertically between the first transistors and the second semiconductor layer.

15. The computing device of claim 14, wherein the computing device is a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *